(12) United States Patent
Wolinski et al.

(10) Patent No.: US 7,873,811 B1
(45) Date of Patent: Jan. 18, 2011

(54) POLYMORPHOUS COMPUTING FABRIC

(75) Inventors: Christophe Czeslaw Wolinski, Los Alamos, NM (US); Maya B. Gokhale, Los Alamos, NM (US); Kevin Peter McCabe, Los Alamos, NM (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 736 days.

(21) Appl. No.: 10/383,780

(22) Filed: Mar. 10, 2003

(51) Int. Cl.
*G06F 15/76* (2006.01)

(52) U.S. Cl. ...................................................... 712/15

(58) Field of Classification Search ..................... 712/15
See application file for complete search history.

(56) References Cited

U.S. PATENT DOCUMENTS

| | | | | |
|---|---|---|---|---|
| 5,541,862 A * | 7/1996 | Bright et al. ................. 702/122 |
| 5,742,180 A * | 4/1998 | DeHon et al. .................. 326/40 |
| 5,887,138 A * | 3/1999 | Hagersten et al. ........... 709/215 |
| 5,970,254 A * | 10/1999 | Cooke et al. ................... 712/37 |
| 6,023,742 A * | 2/2000 | Ebeling et al. .............. 710/107 |
| 6,023,755 A * | 2/2000 | Casselman .................... 712/37 |
| 6,078,736 A | 6/2000 | Guccione ............... 395/500.17 |
| 6,243,851 B1 | 6/2001 | Hwang et al. ................. 716/10 |
| 6,247,110 B1 | 6/2001 | Huppenthal et al. ........... 712/15 |
| 6,289,440 B1 * | 9/2001 | Casselman .................. 712/227 |
| 6,292,018 B1 * | 9/2001 | Kean ............................ 326/41 |
| 6,351,143 B1 | 2/2002 | Guccione et al. .............. 326/40 |
| 6,438,737 B1 | 8/2002 | Morelli et al. ................. 716/16 |
| 6,442,732 B1 | 8/2002 | Abramovici et al. ........... 716/4 |
| 6,457,164 B1 | 9/2002 | Hwang et al. ................... 716/8 |
| 6,757,761 B1 * | 6/2004 | Smith et al. .................. 710/100 |
| 6,799,265 B1 * | 9/2004 | Dakhil ....................... 712/217 |
| 6,813,701 B1 * | 11/2004 | Ansari ............................ 712/4 |
| 6,836,839 B2 * | 12/2004 | Master et al. .................. 712/29 |
| 6,892,291 B2 * | 5/2005 | Pechanek et al. .............. 712/11 |
| 6,948,050 B1 * | 9/2005 | Gove et al. ..................... 712/35 |
| 2001/0056570 A1 | 12/2001 | Agrawal et al. ............... 716/16 |
| 2002/0138682 A1 | 9/2002 | Shatas et al. ................ 710/306 |

OTHER PUBLICATIONS

Arnold, J. M., Buell, D. A., Hoang, D. T. "The Splash 2 Processor and Applications." IEEE 1993, pp. 482-485.*

* cited by examiner

*Primary Examiner*—Jacob Petranek
(74) *Attorney, Agent, or Firm*—Thomas S. O'Dwyer; James C. Durkis; John T. Lucas (57) ABSTRACT

Fabric-based computing systems and methods are disclosed. A fabric-based computing system can include a polymorphous computing fabric that can be customized on a per application basis and a host processor in communication with said polymorphous computing fabric. The polymorphous computing fabric includes a cellular architecture that can be highly parameterized to enable a customized synthesis of fabric instances for a variety of enhanced application performances thereof. A global memory concept can also be included that provides the host processor random access to all variables and instructions associated with the polymorphous computing fabric.

19 Claims, 8 Drawing Sheets

POLYMORPHOUS COMPUTING FABRIC

STATEMENT OF GOVERNMENT INTEREST

The invention described herein may be manufactured and used by or for the United States Government for Governmental purposes without the payment of any royalties.

TECHNICAL FIELD

The present invention is generally related to data processing systems and methods thereof. The present invention is also related to cellular and collective computing techniques and systems. The present invention is additionally related to fabric-based computing architectures.

BACKGROUND OF THE INVENTION

The notion of cellular computation, including the collective computation by an array of regularly interconnected nodes, has been a recurring theme in computer architecture since the early days of computer science. Ranging from cellular automata to systolic arrays, a large body of algorithms and architectures have centered on the notion of a fabric composed of simple automata interacting with immediate neighbors in an n-dimensional mesh. Fabric-based architectures are particularly attractive for efficient layout in VLSI, and specialized chips have been devised for solving specific computational problems, especially in image and array processing. Specialized ASICs, however, designed to solve specific instances of problems are not cost-effective, and relatively few of the scores of designs have actually been fabricated, with virtually none seeing widespread use.

Fabric-based architectures have been an attractive design point within the reconfigurable computing community. One of the first proposals for a fabric-based architecture using commercial FPGAs was the Programmable Active Memory from the DEC Paris Research Laboratory. Based on FPGA technology, a PAM (Programmable Active Memories) is a virtual machine controlled by a standard microprocessor, and can be dynamically configured into a large number of application-specific circuits. PAM introduced the concept of "active" memory, and is generally attached to a high-speed bus of a host computer, similar to most RAM modules. Unlike RAM, however, the PAM processes data between write and read instructions.

Another important concept is that of bi-directional communication links such as the communication structure proposed by the Remarc project, a fabric-based mesh co-processor. Although the Remarc project does offer a number of advantages, this type of architecture does not permit an associated communications network to operate concurrently with cellular computation, which is important in permitting full utilization of the cell in the fabric.

Programmable data paths have also been proposed, such as linear arrays of function units composed of 16-bit adders, multipliers and registers connectable through a reconfigurable bus. In such architectures, logic blocks are generally optimized for large computations, thereby performing operations more quickly (i.e., and consuming less chip area) than a set of smaller cells connected to form the same type of architecture.

Other architectures incorporate a configurable cache to hold recently stored configurations for rapid reloading (e.g., five cycles instead of thousands of processor cycles). Such architectures, however, typically do not adequately hold instruction set-programs for the cells, thereby limiting their usefulness in highly computational applications.

One final concept is the notion of systolic flow execution, which is essentially the ability to flow data to function units from an interconnection network in addition to the traditional mode of fetching operands from memory to execute in the function units. In some architectures, a flow graph may be automatically mapped to a processing element in the array. Here, the granularity of operation plays a vital role in system performance. These type of architectures, however, rely upon a pre-defined function unit and are typically not customizable.

Based on the foregoing, the present inventors have concluded that a need exists for an improved fabric architecture based on a mesh-connected configurable network of runtime re-configurable cells. Present architectural methods and systems lack this important ability. Thus, the invention disclosed herein has been designed to overcome the problems associated with current fabric-based architectures and systems thereof.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide for improved data-processing systems and methods.

It is another aspect of the present invention to provide for improved cellular and collective computing techniques and systems.

It is a further aspect of the present invention to provide for an improved fabric-based computing architecture.

The above and other aspects can be achieved as will now be summarized. Fabric-based computing systems and methods are described herein, which include a polymorphous computing fabric that is customizable on a per application basis. The polymorphous computing fabric disclosed by the present inventors herein is essentially a computation accelerator that is customizable to a specific application, and behaves like a processing memory in which data are not only stored but also processed. The polymorphous computing fabric, together with a host processor, can comprise a Fabric-Based System (FBS).

According to one possible embodiment of the present invention, a generic fabric can physically be composed of a mesh-connected configurable network of runtime re-configurable computation cells. Each cell in the fabric generally contains a separate local data memory and local program memory. The collections of all the local memories constitutes a linear memory that can be dual ported so that it is accessible by either the cell or the host processor in the FBS. The polymorphous computer fabric described herein can support different computing models, including, but not limited to: multiple instruction multiple data (MIMD), single program multiple data (SPMD), and systolic flow execution. The polymorphous computing fabric can also permit dynamic reconfiguration of communication patterns between cells and within cells.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

The invention described herein generally provides a polymorphous computing fabric that is customizable on a per application basis. The polymorphous computing fabric disclosed herein is essentially a computation accelerator that can be customized to a specific application, and behaves like a processing memory in which data are not only stored but also processed. The present invention includes a flexible, modular and generic approach to the composition of specific cell architectures, thereby facilitating the rapid creation of fabric instances. The present invention is also related to the notion of aggregating each cell's local memory into a global memory accessible to a host control processor. With this approach, a specific cellular architecture well matched to a given class of algorithms can be created, while simultaneously optimizing resource usage. In addition, permitting a host processor direct access to each cell's local memory can reduce the bottleneck of communicating data and programs thereof to the cellular array. Communication with the fabric thus can occur over a bi-directional data network.

In accordance with one embodiment of the present invention, the basic fabric can include a mesh-connected configurable network of runtime re-configurable cells. Each cell within the fabric can possess a separate local data memory and local program memory. The collections of all the local memories constituting a global memory can be dual ported so that it is accessible by either the cell or the host processor in the Fabric-Based System (FBS). In addition to coordination by the host processor, each cell generally is associated with its own microcontroller. Thus, the control in the FBS is essentially distributed. Each cell is generally capable of conditional execution, allowing local events to be propagated to other cells.

This versatile computing fabric described herein can support a variety of computing and communications alternatives. Cells on the outer mesh border can broadcast to others on the border. Local nearest neighbor communications facilitates systolic computations. Because each cell has its own program memory and control unit, MIMD computing is possible. If the same program is executed by all of the cells SPMD computing can be accomplished. Moreover, systolic flow execution is possible. In this model of execution, data can flow to the function units from an interconnection network in addition to the traditional mode of fetching operands from memory to execute in the function units. For synchronization, the host processor can broadcast a start or stop signal to the fabric, and can observe any cell's status bit.

Figure 1:
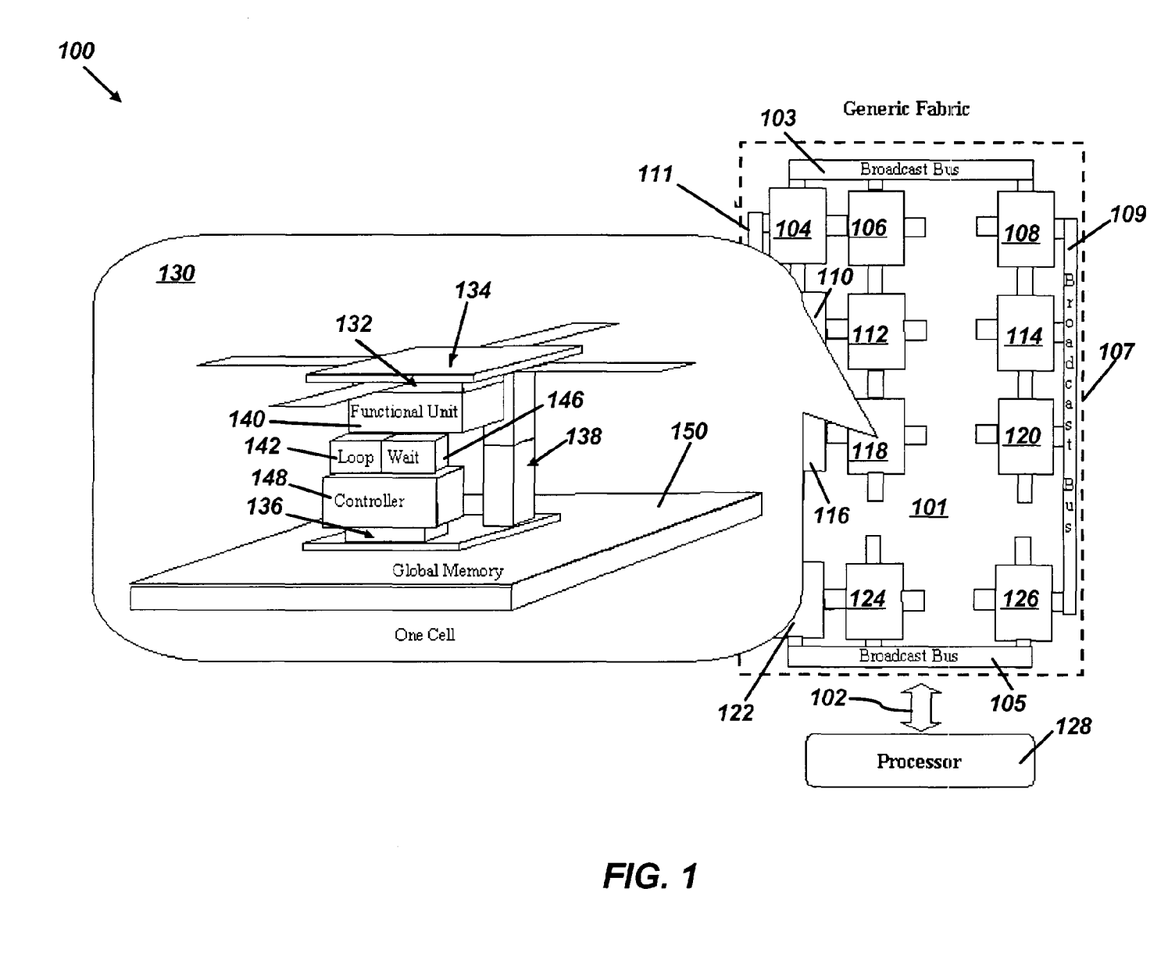
FIG. 1 illustrates a block diagram of a fabric system, which can be implemented in accordance with a preferred embodiment of the present invention.

FIG. 1 illustrates a block diagram of a fabric system 100, which can be implemented in accordance with a preferred embodiment of the present invention. It can be appreciated by those skilled in the art that FIGS. 1 to 8 described herein represent possible embodiments of the present invention, and that a wide variety of modifications thereof, including varying cellular and fabric architectures are possible, while still falling within the scope and spirit of the present invention described herein. Thus, according to the example depicted in FIG. 1, system 100 can include a generic fabric 101 that includes a plurality of cells 104, 106, 108, 110, 112, 114, 116, 118, 120, 122, 124, and 126. Cells 104, 106, and 108 can communicate directly with a broadcast bus 103, while cells 122, 124 and 126 can communicated directly with a broadcast bus 105. Likewise, cells 108, 114, 120, and 126 can communicate with broadcast bus 109, and cells 104, 110, 116 and 122 can communicate with broadcast bus 111. A dashed line 107 in FIG. 1 generally represents the limit of global memory. Additionally, a processor 128 can communicate with fabric 101 as indicated by arrow 102.

FIG. 1 generally depicts a layout 130 of the fabric and architecture of the single cell 118, which is generally composed of a plurality of modules, including a communications module 134 and a data access module 132. Layout 130 graphically illustrates the structure of cell 118. In addition, layout 130 of cell 118 illustrates a function unit 140 in juxtaposition with a loop module 142 and a wait module 146. A controller 148 (e.g., a microcontroller) can be disposed adjacent to a program memory 136, which in turn is associated with a global memory 150. Controller 148 generally includes wait and loop modules 142 and 146. A data memory 138 can also be associated with cell 118. Note that cell 118 can include one or more dual port data memories. It can be appreciated by those skilled in the art that a similar layout structure is associated with each of the other cells 104, 106, 108, 110, 112, 114, 116, 120, 122, 124, and 126.

The cells 104, 106, 108, 110, 112, 114, 116, 118, 120, 122, 124 and 126 can be configured by parameters that are generally set prior to mesh generation. Such parameters include, for example, the size of the network and the size of the communication busses. The choice of a function unit, such as, for example, function unit 140 of FIG. 1, for a given class of applications is also an important cell configuration parameter, in addition to the number and size of local memories. The type of memory access (e.g. random, sequential, circular) is also an important cell design parameter, in addition to the instruction set layout and the communication direction. Other parameters can be modified during fabric execution. For example, a cell's communication pattern can be modified during application execution. The behavior of a cell can also be modified during fabric execution, in addition to the conditional reconfiguration of the cell's memory access patterns.

Figure 2:
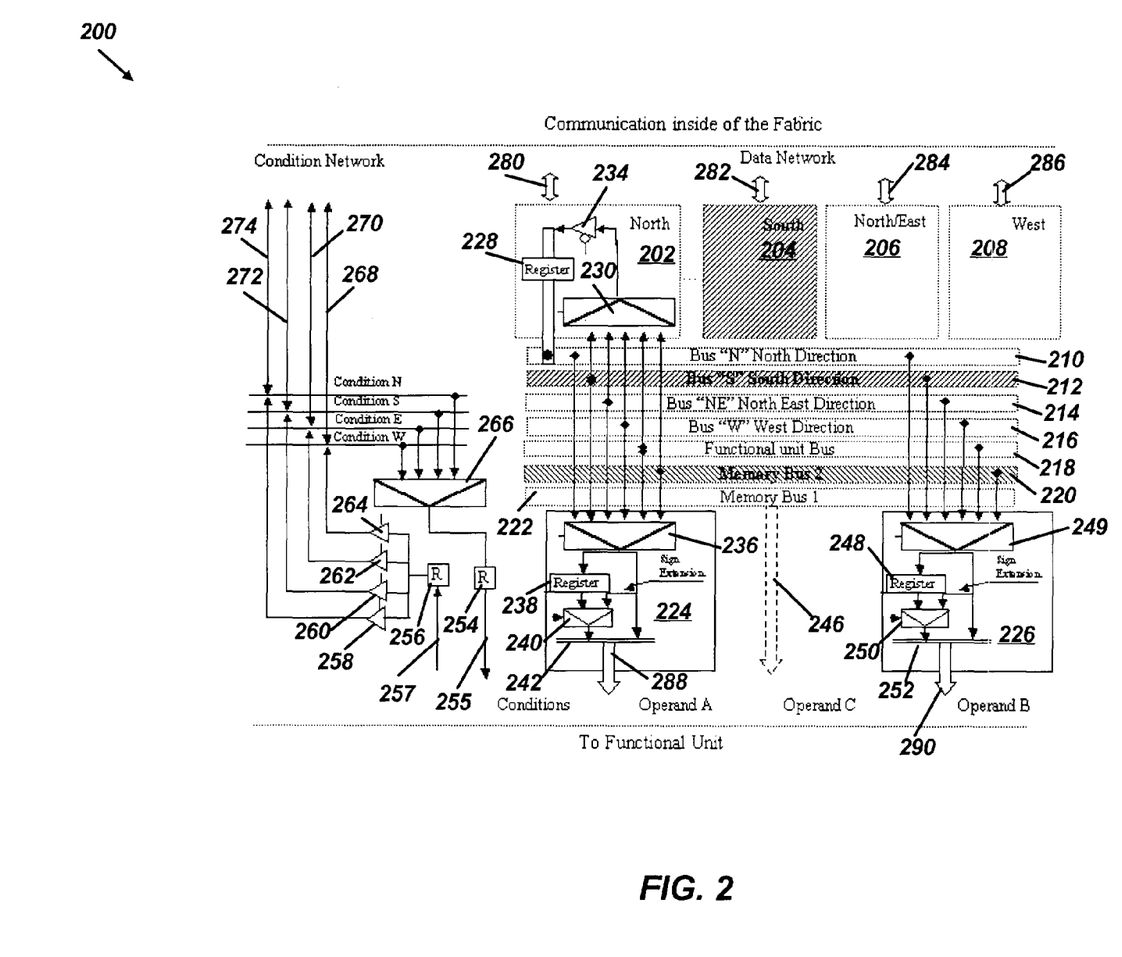
FIG. 2 illustrates a block diagram of a communication and access control system, which can be implemented in accordance with a preferred embodiment of the present invention.

FIG. 2 depicts a block diagram of a communication and access control system 200, which can be implemented in accordance with a preferred embodiment of the present invention. A communications module (e.g., communications module 134 of FIG. 1) can connect a particular cell (e.g., cells 104, 106, 108, 110, 112, 114, 116, 118, 120, 122, 124, and/or 126 of FIG. 1) to a data network and/or a condition network. Such a communications module can send data to and receive data from the cell's immediate neighbors in the mesh, including its diagonal neighbors, and to or from the local memories and local function unit. It can feed the function unit with data arriving from different sources. This type of communications module is thus highly parameterized. It is possible to synthesize only the needed communications interfaces and busses that optimize the limited resources of the chip. Thus, FIG. 2 illustrates an example where an unused datapath 212 (i.e., Bus "S" South Direction) to an adjacent cell can be removed and a connection to a second local memory 220 (i.e., Memory Bus 2) can be added.

As depicted in FIG. 2, datapaths 210, 212, 214, 216, and 218 can respectively communicate with interfaces 202, 204, 206, 208, 224 and 226. A first memory bus 222 can communicate with a function unit, as indicated by arrow 246. Interfaces 202, 204, 206 and 208 can respectively communicate with a data network, as indicated respectively by arrows 280, 282, 284, and 286. Interface 202 generally includes a register 228 which can receive data from a logic component 234 and the network, which in turn receives data 230 from datapaths 210, 212, 214, 216, 218 and/or memory bus 220. Similarly, interface 224 includes a register 238 which can receive data 236 from interface 202 transmitted along one or more of datapaths 210, 212, 214, 216, 218 and/or memory bus 220.

Data 240 provided by register 238 can be transmitted to a bus 242 and then sent to the function unit (e.g., function unit 140 of FIG. 1), as illustrated by arrow 288. Likewise, interface 226 includes a register 248 which can receive data 249 from one or more of interfaces 202, 204, 206 and/or 208 transmitted along one or more of datapaths 210, 212, 214, 216, 218 and/or memory bus 220. Data 250 provided by register 248 can then be transmitted to a bus 252 and then to the function unit, as indicated by arrow 290. It can be appreciated by those skilled in the art that interfaces 204, 206 and 208 can also include a similar internal structure. Additionally, in FIG. 2, arrows 268, 270, 272, and 274 indicate the respective transmission of data to and/or from the condition network to and/or from logic components 264, 262, 260 and/or 258. Logic components 264, 262, 260 and 258 can respectively receive data from a register 256. Register 256 can receive data from the function unit, as indicated by arrow 257. Data 266 can also be transmitted to one or more function units from a register 254 as indicated by arrow 255.

The function unit generally performs operations on two or more operands, such as Operand A, Operand C, and/or Operand B. In such a modular architecture, function units can be designed for application classes and can be replaced without affecting other aspects of the fabric. A variety of different function unit modules can be implemented, in accordance with the invention described herein. Two such modules are illustrated in FIGS. 3 and 4 herein.

Figure 3:
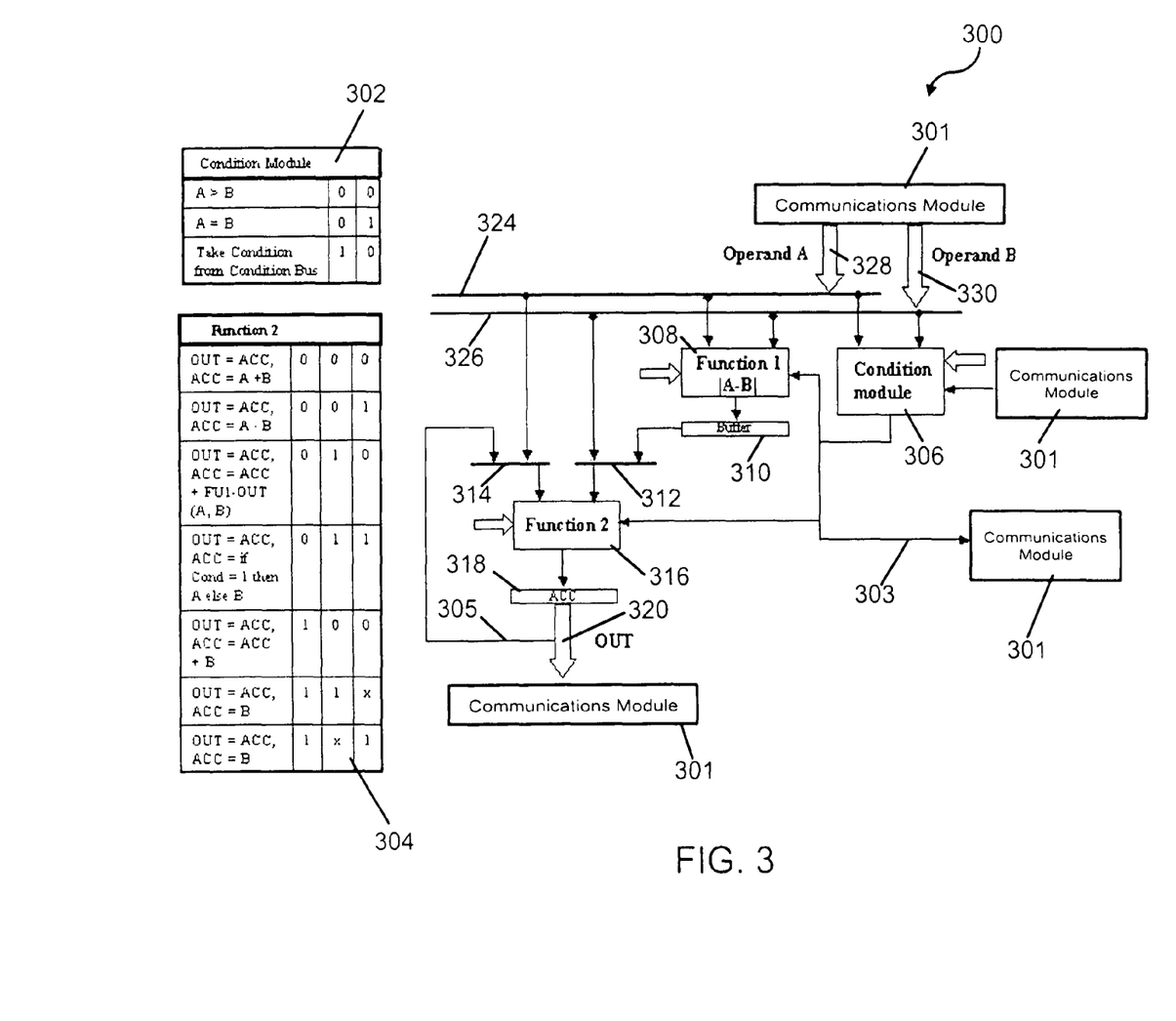
FIG. 3 illustrates a schematic diagram depicting the general layout of a first function unit module, which can be implemented in accordance with a preferred embodiment of the present invention.

FIG. 3 illustrates a schematic diagram depicting the general layout of a first function unit module 300, which can be implemented in accordance with a preferred embodiment of the present invention. First operand data 328 (i.e., Operand A) is generally transmitted from a communications module 301 to a first bus 324. Note that communications module 301 of FIG. 3 is generally analogous to communications module 134 of FIG. 1. Second operand data 330 (i.e., Operand B) can also be transmitted from communications module 301 to a bus 326. Thus, first operand data 328 can be obtained from bus 324 by a first function unit 308, while second operand data 330 can be obtained from bus 326 by the first function unit 308. Second operand data 330 can be transmitted from bus 326 to bus 312, first function unit 308 and/or a condition module 306 (e.g., a condition network). First function unit 308 (i.e., Function 1) in turn can transmit data to a buffer 310, which in turn passes data onto a bus 312. Data in turn can then be transmitted from bus 312 to a second function unit 316. Similarly, data from first operand 328 can be transmitted to bus 314, first function unit and/or condition module 306.

Condition module 306 can receive conditions (i.e., conditional data) from communications module 301. Data from second function unit 316 can be further transmitted to an ACC unit 318 and then as indicated by arrow 320, transmitted to communications module 301. Similarly, as indicated by arrow 303, data can be transmitted to and/or from communications module 301 to and/or from first function unit 308, second function unit 316 and/or condition module 306. Data can also be provided as feedback from ACC unit 318 to bus 314, as indicated by arrow 305. FIG. 3 additionally illustrates a logic chart 302 associated with condition module 306 and a logic chart 304 associated with function unit 316 (i.e., Function 2). Within module 300, first function unit 308 can generally be optimized for a distance calculation, while second function unit 316 can perform one or more of seven possible logical operations, as indicated by logic chart 304.

Figure 4:
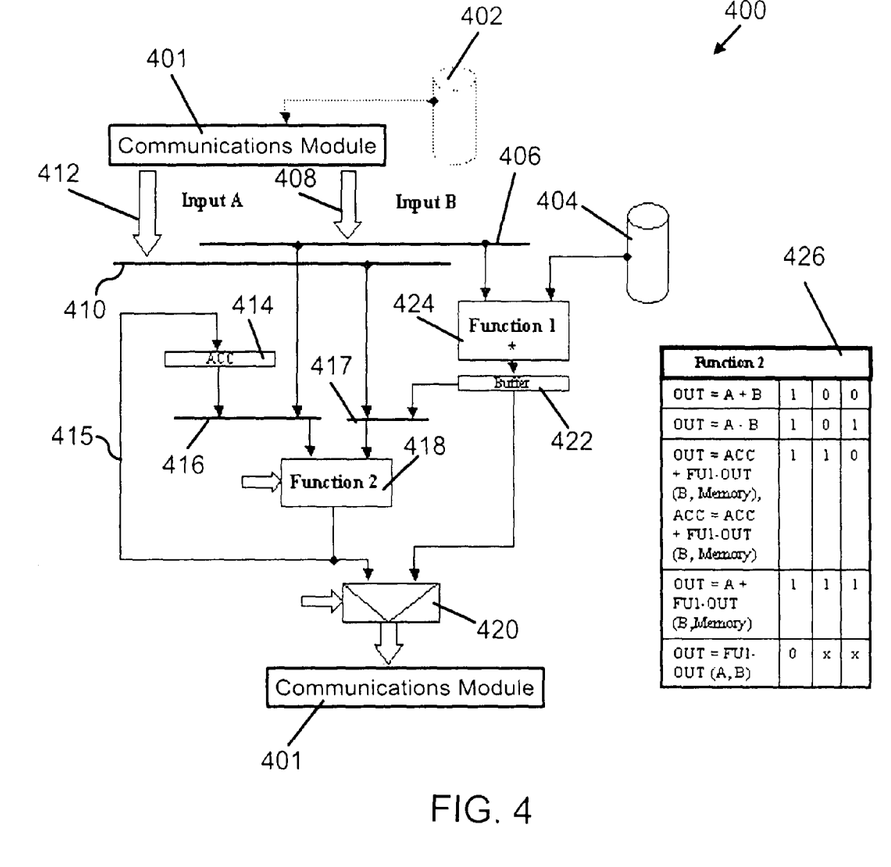
FIG. 4 illustrates a schematic diagram depicting the general layout of a second function unit module, which can be implemented in accordance with an alternative embodiment of the present invention.

FIG. 4 depicts a schematic diagram depicting the general layout of a second function unit module 400, which can be implemented in accordance with an alternative embodiment of the present invention. Module 400 generally includes a first memory 404 with sequential or circular access and a first function unit 424. First function unit 424 can receive data from first memory 404 and/or a bus 406. Module 400 also includes an optional second memory 402 with sequential or circular access. Data can be retrieved from second memory 402 by a communications module 401. Note that communications module 401 of FIG. 4 is generally analogous to communications module 134 of FIG. 1 and communications module 301 of FIG. 1. This data can be transmitted by communications module 401 as a first input 412 (i.e., Input A/Operand A) to a bus 410 as indicated by arrow 412.

The data can also be transmitted by communications module 401 as a second input 408 (i.e., Input B/Operand B) to bus 406. Data from bus 410 can be provided to a bus 417 along with data from a buffer 422, which receives output data from first function unit 424. Data from bus 406 can also be communicated to a bus 416, which also receives data from an ACC unit 414. Data from bus 416 and bus 417 are then provided to a second function unit 418, which is then communicated, along with output data from buffer 422, as combined data 420, which is transmitted to communications module 401. Output from second function unit 418 can also be provided as feedback to ACC unit 414, as specifically indicated by arrow 415.

In module 400, first function unit 424 can generally perform a multiply function, while second function unit 418 can perform one of 5 possible logical operations, as indicated by logic chart 426. Module 400 can be optimized for DSP intensive processing. Module 400 generally includes three inputs. The source of two inputs (i.e., Inputs A and B) can be determined by an Access Control Module (not shown in FIG. 4).

The third source is simply local memory (e.g., memory 404). Local memories can be accessed using random, sequential, or circular modes. The circular access mode is particularly well suited for delay line implementation, sliding window, and/or repetitive coefficients access.

A microcontroller (e.g., controller 148 of FIG. 1) can execute instructions from the Program Memory. The instruction set generally includes nine generic instructions where the instruction field meaning depends upon a specific cell configurations. The first instruction can be implemented as a configure instruction. This instruction configures the Function 1 unit (e.g., first function units 308/422) and a condition unit. It selects communications busses, direction of communication, access mode (i.e., random, sequential, or circular) to local memories, and whether the function unit will operate in 8-bit, 16-bit or 32-bit modes.

The second instruction can be implemented as a control instruction. This instruction directs whether or not the function unit performs an accumulate function, and whether or not to perform a memory read or write access. Additionally, the control instruction can control which 8 bits of a 16 bit operand are to be accessed and can enable I/O (Input/Output) to and/or from pipelined communication busses according to the communication pattern established by the configure instruction. The "wait count" field of the control instruction serves a variety of functions. For example, it can be utilized for looping operations. If a loop count field is non-zero, the instruction can repeat the operations (e.g., an accumulation function) for the specified number of cycles. It can also be used for time synchronization, so that the cells wait for a specified number of cycles before continuing with the next instruction.

The third instruction can be implemented as a jump instruction. This is the unconditional branch instruction to a 7-bit address. The fourth instruction is a conditional jump instruction, in which a jump is executed if a condition register is zero. The fifth instruction is a start loop instruction, which marks the beginning of a loop body. A 7-bit loop count can be included in this instruction.

The sixth instruction can be implemented as an end loop instruction, which marks the end of the loop body. If the loop count has reached zero, a branch can be executed to the address supplied within the instruction. The combination of control with start/end loop instructions provide for two levels of nested loop operations. The end loop instruction can also reset memory address counters and enable or disable memory and accumulator operations. This in turn can reduce the number of instructions necessary for a loop body implementation, in many cases by two cycles.

The seventh instruction can be implemented as a stop-then-wait-for-start instruction. The purpose of this instruction is to stop cell execution, setting the internal status bit to 1, and waiting for the next start signal to arrive from the host processor. When the start signal is received, a branch can be executed to a 7-bit address supplied within the instruction, and the status bit then changes to 0.

The eighth instruction can be implemented as a reset instruction, which can selectively reset the specified function unit internal registers and then wait for a specified number of cycles. As with the control instruction, the rest can be utilized for both looping as well as synchronization. The ninth and final instruction can be implemented as a load instruction, which generally initializes the memory address counter and limits registers for circular address generation thereof. A combination of configure and load instructions can be utilized for RAM (Random Access Memory).

The aforementioned instructions generally expose the microarchitecture of a fabric cell, and can provide the programmer with control over all the communication busses, memory and function units. This architecture can also be utilized to communicate independently of computation. Thus, for example, a cell can compute utilizing local memory while simultaneously forwarding data through the interconnection network. The data distribution pattern can be dynamically reconfigured without affecting the state of computation. In addition, such an architecture can provide an optimized loop control mechanism for up to two nested loops. If a higher level of loop nest is desired, the host processor must coordinate the outer loops using the fabric start/stop mechanism.

Hybrid Configurable System on a Chip (CSOC) architectures have been proposed over the last several years. Recently, such devices have begun to appear as commercial offerings. In contrast to traditional FPGAs, these integrated systems offer a processor and an array of configurable logic cells on a single chip. The present invention can be implemented, for example, on an Altera Excalibur™ ARM hybrid system. This chip contains, for example, an industry-standard ARM922T 32-bit RISC processor core operating at up to 200 MHz (equivalent to 210 Dhrystone MIPS). A Memory Management Unit (MMU) can be included for real-time operating system support. Such an architecture can build upon features of the APEX™ 20KE PLD, with up to 1M gates. Excalibur™ ARM offers two methods of communication between ARM processor and user logic: the first, using a slave/master bridge connected to a second level internal bus AHB2 (advanced High-Performance Bus) and the second, utilizing a dual port memory connected directly to the AHB2. It can be appreciated by those skilled in the art that such components and devices are not considered limiting features of the present invention. Instead, such components and devices represent merely one set of possible components and devices that can be utilized to implement an embodiment of the present invention. Various other devices and components not discussed herein can be utilized to implement other embodiments of the present invention, preferred or otherwise.

Figure 5:
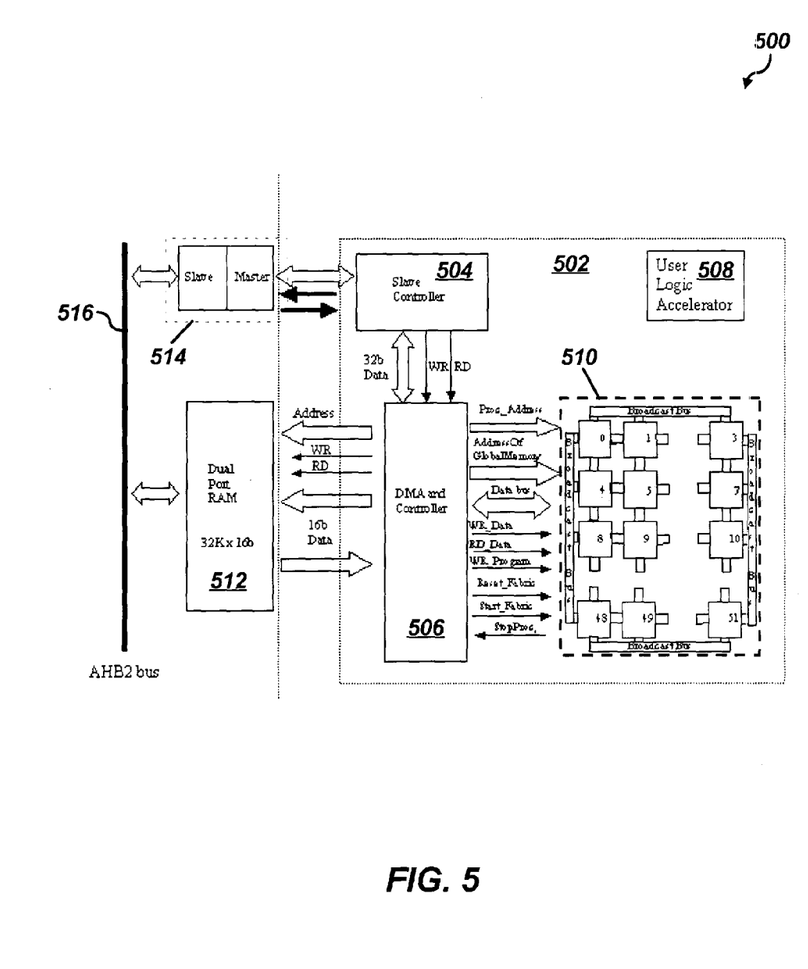
FIG. 5 illustrates a block diagram of a communication system that can be implemented between a fabric and an ARM processor, in accordance with a preferred embodiment of the present invention.

Thus, FIG. 5 depicts a block diagram of a communication system 500 that can be implemented between a fabric and an ARM processor, in accordance with a preferred embodiment of the present invention. As indicated in FIG. 5, a fabric 510 can be connected to a dual port memory 512 (on one side) via a DMA/controller unit 506 and accessible by an ARM processor (from the other side) instead of directly to a slave bus. Dual port memory 512 can communicate with a bus 516 (i.e., an AHB2 bus) and with DMA/controller unit 506. DMA/controller unit 506 can also communicate with a slave controller 504, which in turn can communicate with a master/slave bridge 514 that also can communicate with bus 516. Such a configuration is desirable because an AHB Master Port is about 10 times slower than a dual port memory for communication.

The example configuration illustrated in FIG. 5 generally utilizes 16-bit data paths for communication between the ARM and a two-dimensional mesh of 52 processor (i.e., fabric 510). Fabric/host communication is generally handled by a controller (i.e., DMA/controller unit 506) that manages both direct memory access to a 32 K 160 bit dual port RAM (i.e., dual port memory 512) and to a 32-bit bridge (i.e., master/slave bridge 514) to the AHB2 bus (i.e., bus 516) of the ARM. Through the master/slave bridge 514, the host can command the DMA/controller unit 506 to send the program to given cells of fabric 510 and also send data to given cells of fabric 510. Additionally, the host can command the DMA/controller unit 506 to receive data from fabric 510, send reset data, a start strobe and read a stop signal via the master/slave bridge 514.

Fabric 510 generally utilizes 8-bit data paths for communication with 8-bit registers, with instruction set support for 16-bit function unit operations. With manual placement (i.e., placement directives can be generated by script), 52 cells can be instantiated (e.g., 13 rows×4 columns) on a device such as, but not limited to, an Excalibur™ ARM EPXA 10F1020C2. Note that the clock frequency for both function unit modules 1 and 2 (i.e. systems 300 and 400) is generally 33 MHz, which provides a peak performance of approximately 10.2 GigaOps/s and 1.8 GMAC/s, respectively.

A number of tools can be utilized to simplify program development and initialization of the fabric. A single assembler, for example, can be utilized to support all of the fabric instances, because the instruction set generally includes nine generic instructions with fabric-instance-dependent fields.

A Procedure Access Generator (PAG) can be utilized by the subroutines to communicate data and programs between the ARM processor and the fabric. Sending the programs and the data from an ARM host processor to a particular cell through a dual port memory is a complicated task. The processor must test the state of the access controller to be sure that the previously executed command is finished. The processor also must compose an appropriate command word to send the data or program to a given cell in the fabric. To simplify this task, the PAG can generate a specific access procedure from the assembler source file that permits the processor to send the program or data to a given set of cells declared in the source file.

Figure 6:
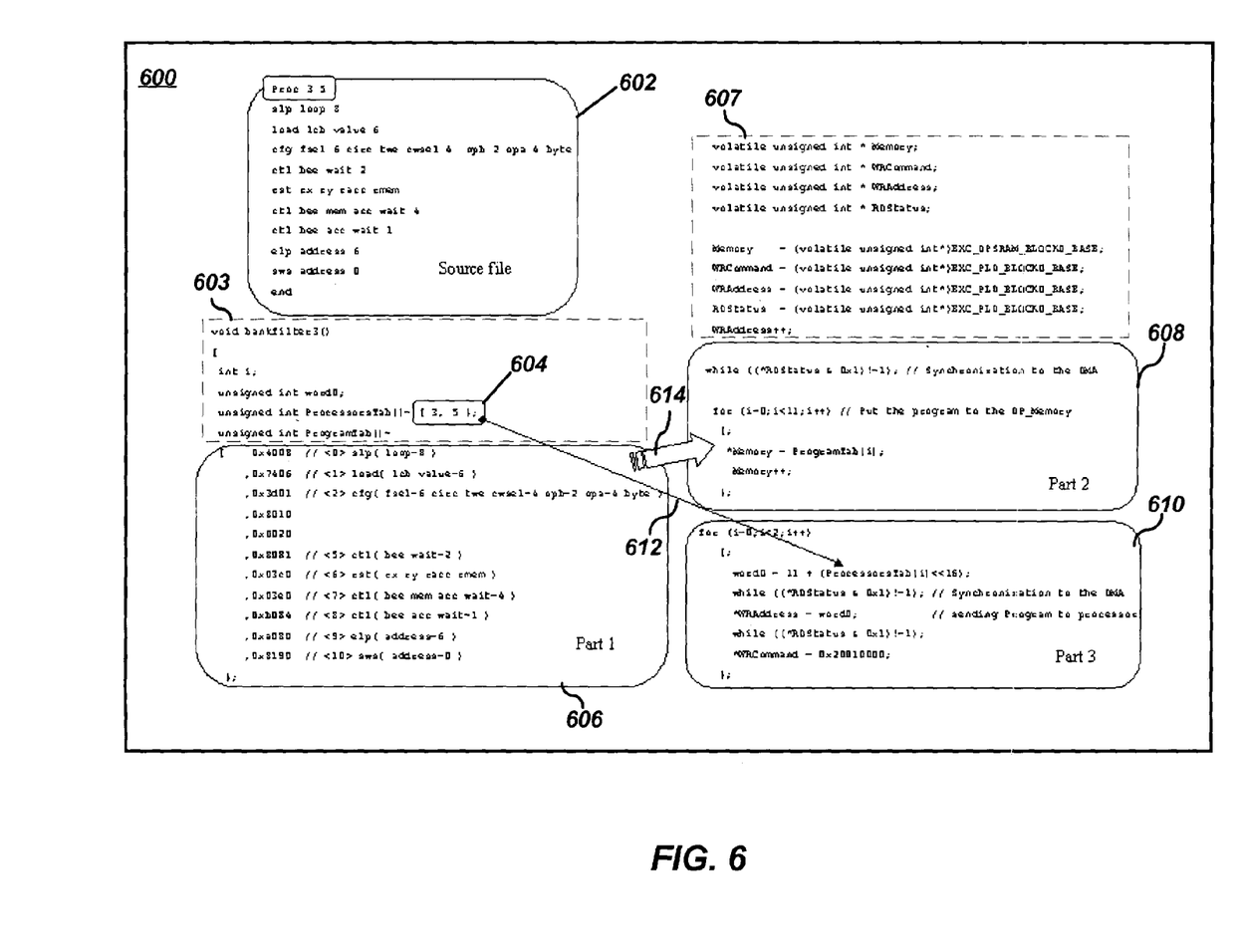
FIG. 6 illustrates a flow diagram of an automatically generated procedure for sending a program to given cells, in accordance with a preferred embodiment of the present invention.

FIG. 6 depicts a flow diagram 600 of an automatically generated procedure for sending a program to given cells, in accordance with a preferred embodiment of the present invention. As indicated in FIG. 6, a source file 602 and a procedure generated from such a source file, as illustrated at parts 606, 608 and 610. Additional code is depicted at code 603 and code 607. Part 1 (i.e., part 606) of C-code corresponds to the results of an assembler tool, while Part 2 (i.e., part 608) copies the program code described in Part 1 to the dual memory. Additionally, Part 3 (i.e., Part 610) sends the contents of the dual port memory to a given set of cells in the fabric. Arrow 614 illustrates the continuation of part 606 to part 608, while arrow 612 indicates the referencing of data 604 to part 610.

Figure 7:
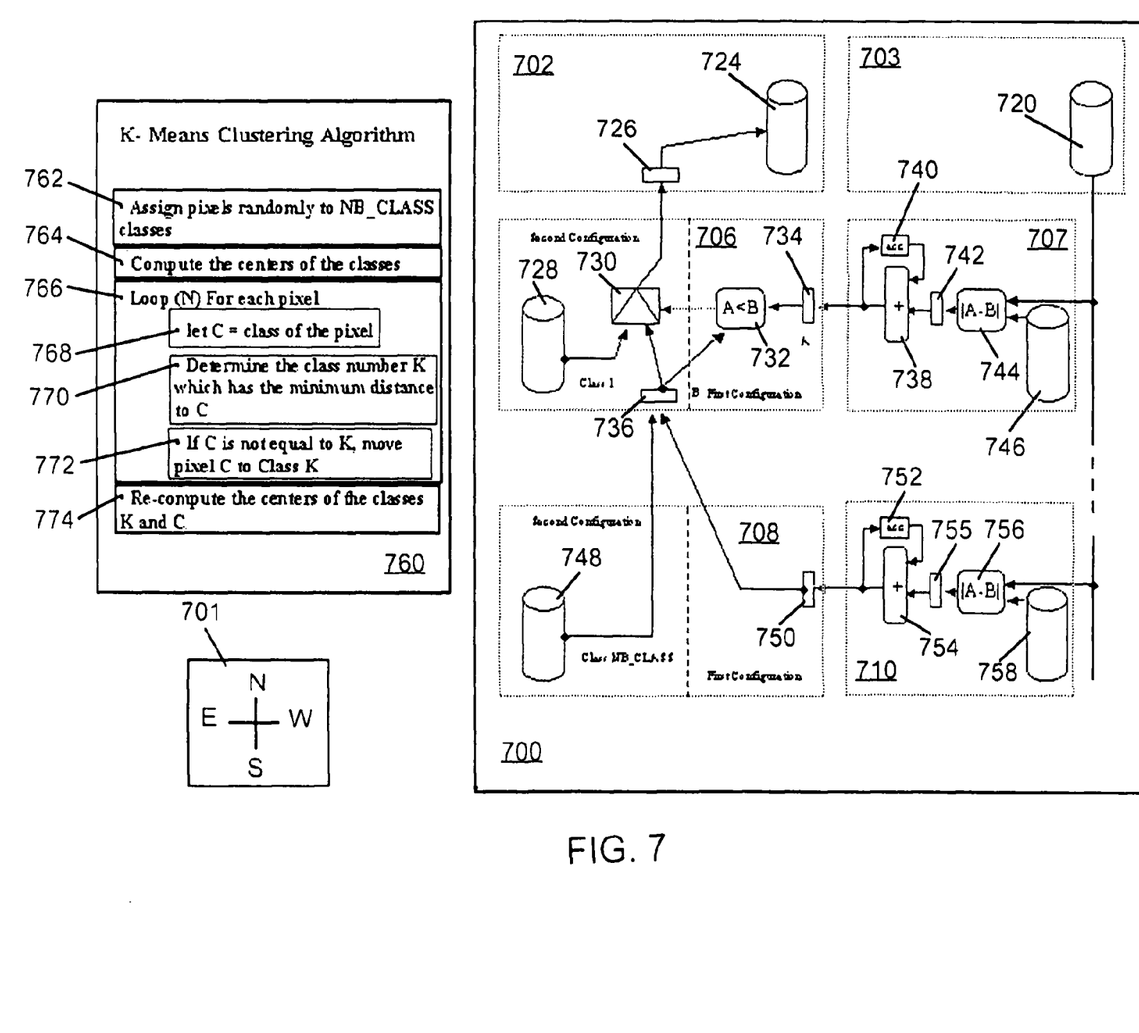
FIG. 7 illustrates a block diagram depicting a K-means clustering system, which can be implemented in accordance with the present invention.

Many applications can be successfully implemented on two fabric instances. However, each application possesses different properties and requires different fabric parameters. A K-means clustering algorithm application, for example, requires a large granularity function unit (with a one cycle execution of the absolute value of the different and an accumulation), and a data dependent dynamic configuration of the communication pattern for index processing. FIG. 7 depicts one possible implementation thereof.

FIG. 7 illustrates a block diagram depicting a K-means clustering system 700, which can be implemented in accordance with the present invention. A multi-dimensional vector can be stored within a memory unit 720 of cell 703. Such a multi-dimensional vector can be sent to cells 707 and 710, which are responsible for the distance calculation, while the cells 702, 706, and 708 are responsible for the index calculation. Cell 702 includes a memory unit 724 and a register 726. Memory unit 724 generally functions as a memory for storing the class number associated with the minimum distance to the actual pixel, while cell 703 is associated with a memory unit 720 that functions as a memory of pixels. Cell 706 includes a memory unit 728, a register 736, multiplexer 730, and a logic component 732 (i.e., A<B), which receives data from a register 734 and a register 736.

Cell 706 can be further divided in a first configuration and a second configuration. Cell 707 includes a memory unit 746, a logical component 744 (i.e. absolute value of A-B), a register 742, an adder 738 and an ACC unit 740. Cell 708 includes a memory unit 748 (i.e., Class NM_CLASS) and a register 750. Cell 708 is further divided into a first configuration and a second configuration. Cell 710 includes a memory unit 758, a logical component 756 (i.e., absolute value of A-B), a register 755, an adder 754, and an ACC unit 752. Data from memory unit 720 of cell 703 can be input to logical component 756 along with data from memory unit 758. Data from logical component 756 can then be fed as input to register 755. Similarly, data from memory unit 720 can be input to logical component 744 of cell 707 along with data from memory unit 746.

Memory unit 746 and 758 generally function as a memory of a class's center. Data output from adder 754 of cell 710 can be input to register 750 of cell 708. Data from adder 754 can also be supplied as feedback to ACC unit 752, which can then be fed as input to adder 754 along data from register 755. Data output from register 750 and memory unit 748 of cell 708 can be input to register 736 of cell 706. Data output from register 736 can then be fed supplied to logical component 732 or taken as data 730, which is then supplied to register 726. Data 730 also includes data retrieved from memory unit 728.

The cells depicted in FIG. 7 can be arranged in a two-stage pipeline mode. Once the distances are calculated, they can be stored in appropriate registers of cells 702, 706, and 708. At this moment, cells 702, 706, and 708 can initiate the index calculation. This index calculation starts from cell 708. It is generally necessary to implement a run time conditional reconfiguration mode for the implementation of this processing because the index calculation cell should send the minimum distance index to its north neighbor. The index comes either from the south direction or from its local memory. Note that the appropriate directions are shown in directional box 701. In general, the fabric-based implementation of a K-means algorithm is nearly as fast as a direct hardware implementation. It requires only two additional cycles for a distance calculation. The area overhead is generally 5× before optimization and 1.4× after unused modules are manually removed.

Also illustrated in FIG. 7 is a high-level flow chart 760, which depicts general logical operational steps for implementing a K-means clustering algorithm application in accordance with a preferred embodiment of the present invention. As depicted at block 762, pixels can be randomly assigned to NU_CLASS classes.

Thereafter, as illustrated at block 764, the centers of the classes can be computed. Next, as depicted at block 766, a loop subroutine can be implemented. Initially, a "Loop (N)" command for each pixel is initiated. As illustrated at block 768, the variable C can be set equal to the class of the pixel. Next, as depicted at block 770, the class number K can be determined, which possesses the minimum distance to C (i.e., the class of the pixel). Thereafter, as illustrated at block 772, if C is not equal to K, the pixel C is moved to class K. Following processing of the loop operation illustrated at block 766, the center of the classes K and C can be re-computed, as depicted at block 774.

Figure 8:
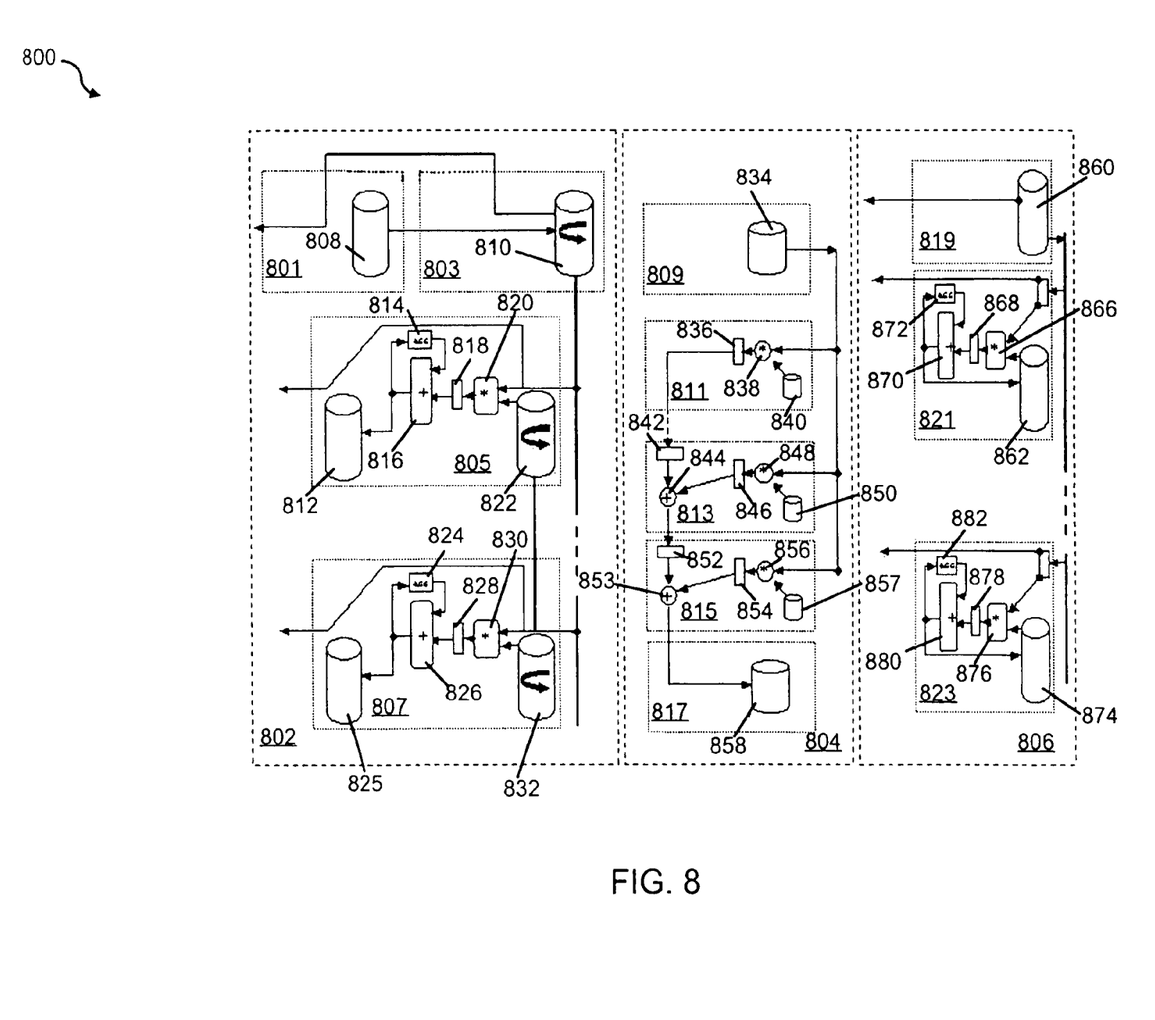
FIG. 8 depicts a block diagram illustrating three systems that can be implemented in accordance with preferred or alternative embodiments of the present invention.

FIG. 8 depicts a block diagram 800 illustrating three systems that can be implemented in accordance with preferred or alternative embodiments of the present invention. System 802 can implement an FIR filter bank application. A bank of FIR filters needs a large granularity function unit using circular access to memory and a broadcast data capability. In system 802, cells 801, 803, 805, and 807 are depicted. Cell 801 includes a memory unit 808, which functions as a samples memory, while cell 803 is associated with a memory unit 810. Cell 805 includes a memory unit 822 that functions as a coefficients memory.

Data from memory unit 822 can be transferred to a multiplier 820, when in turn can be transferred to a register 818. Cell 805 also includes an adder 816, an ACC unit 814, and a memory unit 812 that functions as a results memory. Cell 807 includes a memory unit 832 that functions as a coefficients memory. Data from memory unit 832 can be transferred to a multiplier 830, along with data from memory unit 822 and/or memory unit 810. Cell 807 further includes a register 828, and an adder 826. Cell 807 also includes a memory unit 825 that functions as a results memory and an ACC unit 824.

For the configuration of system 802, approximately fifty-two parallel filters can be implemented, depending upon a desired implementation and/or design parameters. Two cells out of fifty-two can be utilized for storage of the data samples and to implement the delay line of all the filters. This delay line can be implemented by utilizing local memory with circular access. Each cell implements an FIR filter, executes all of the processing, takes the coefficients from one of the local memories accessed in a circular manner, and stores the results to another memory utilizing sequential access. The implementation of system 802 can store up to 256 samples and results and can realize 256 filter taps.

System 804 can implement an N-tap FIR filter application, which requires a smaller granularity three input function (with a one cycle execution of the multiplication and summation), and a systolic flow execution mode. A transposed version of an FIR filter can implemented in accordance with system 804. A delay line thereof can be implemented by systolic communication inside of the fabric. System 804 includes cells 809, 811, 813, 815, and 817. Cell 809 is associated with a memory unit 834 that functions as a samples memory. A cell 811 is associated with a memory unit 840, a multiplier 838, and a register 836. Data from memory unit 834 and/or memory unit 840 can be transferred to multiplier 838 and then to register 836. Thereafter, data from register 836 can be transferred to cell 813. A cell 813 includes a memory unit 850, a multiplier 848, a register 846, a register 842, and an adder 844.

Data from memory unit 834 and/or memory unit 850 can be transferred to multiplier 848 and then to register 846. Thereafter, data output from register 846 can be transferred to adder 844, along with data from register 842, which receives as input, data transferred as output from register 836 of cell 811. A cell 815 includes a memory unit 857, a multiplier 856, a register 854, a register 852, and an adder 853. Data from memory unit 834 of cell 809 can be transferred to multiplier 856, along with data from memory unit 857. Thereafter, data output from multiplier 856 can be transferred to register 854 and then to adder 853, along with data output from register 852. Cell 817 is associated with a memory unit 858 that functions as a results memory. Data output from adder 853 of cell 815 can thus be transferred to and stored within memory 858.

System 806 can implement a vector by matrix calculation application, which can be utilized in many typical DSP applications. System 806 requires a large granularity function, systolic communication mode and direct process access to a local memory. Only one cell is generally utilized to distribute the vector inside of the fabric. The other cells multiply the vector by each specific column. The same local memory can be utilized to read and store the results utilizing sequential and RAM modes. System 806 thus includes cells 819, 821 and 823. Cell 819 can also be associated with a memory unit 860, while cell 821 can include a memory unit 862, a multiplier 866, a register 868, an adder 870, and an ACC unit 872. Cell 823 generally includes a memory unit 874, a multiplier 876, a register 878, an adder 880, and an ACC unit 882.

The present invention thus discloses a computing fabric that includes a parameterized cellular array connected to a host processor. The parameterized nature of such an array permits generation of the fabric for specific classes of applications. The cellular architecture of the fabric described herein is highly parameterized and can enable customized synthesis of fabric instances to achieve enhanced performance for different classes of applications. This approach is made possible by the modular architecture of the fabric described herein. Another unique feature of the fabric disclosed herein is the use of global memory. This type of memory provides the host process random access to all variables and instructions on the fabric's cells. The memory can be initialized in the same manner as a standard memory in a computer or other data processing system. Programs and data can be dynamically loaded during processing on the fabric because the global memory is dual ported. This reduces overhead for preparing the data and programs. The fabric can reconfigure itself during processing by utilizing data generated during fabric execution.

A number of advantages can be provided by the present invention described herein. For example, the performance of the system can be optimized in terms of speed and area because the specific instantiation of the fabric matches closely the given class of the applications. Development time can also be shortened because the architecture is parameterized and does not require verification. Additionally, the communication bottleneck of initialization, configuration, and dynamic reconfiguration of the fabric is reduced by the fact that the data and program memories are directly accessible by the host processor in the FBOS. Finally, data access time during executing can be reduced due to parallel memory access by all of the cells in the fabric and because the communications network runs concurrently. Potential commercial applications of the present invention include, but are not limited to, DSP applications and image processing.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

Having thus described the invention, what is claimed is:

1. A fabric-based computing system that behaves as a processing memory and which is dynamically customizable for execution on an application basis and on a per set of applications at one time due to said fabric's modifiable network parameters and a cellular architecture thereof, said system comprising:

a polymorphous computing fabric comprising an interconnected reconfigurable network composed of a plurality of runtime reconfigurable cells such that each of said runtime reconfigurable cells thereof comprise a plurality of local data memories and at least one local program memory; and a hybrid Configurable System On a Chip (CSOC) processor assembly comprising a host control processor and an integrated array of configurable logic cells on a single chip; and associated electronic components comprising broadcast busses, communication interfaces and registers for placing said CSOC processor assembly in communication with said polymorphous computing fabric's network of reconfigurable cells for random access to variables and instructions associated with the plurality of local data memories and at least one program memory of each said cells contained within said polymorphous computing fabric; and means for the hybrid CSOC processor assembly to modify said network parameters utilizing subroutines in order to—select a cell capability from source file dependent upon a number and size of local memories as well as supporting modular components contained therein, decide upon said cell's operational readiness state via an access controller to ensure that previous instructions have been executed, determine said cell's memory access pattern, bit mode and communication direction, retrieve previously generated data and clear an existing program from the local memories of said cell, compose an appropriate command in order to transmit new information to an address of a selected cell or set of cells, and send a new program or data to a selected cell or set of cells thereby enabling runtime reconfiguration of said cell during an application's execution on the fabric.

2. The fabric-based computing system of claim 1 wherein each of said plurality of reconfigurable cells within said polymorphous computing fabric comprise a plurality of modules that include data access, communications, program memory, data memory, function unit, loop and wait, and controller modules which form a modular architecture thereof, and wherein said plurality of modules are adaptable to permit a change to occur within at least one module thereof without modification to other modules within a cell during runtime reconfiguration.

3. The fabric-based computing system of claim 1 wherein said polymorphous computing fabric further comprises an application specific network of interconnected runtime reconfigurable cells and wherein said plurality of runtime reconfigurable cells further comprises a plurality of heterogeneous runtime reconfigurable cells.

4. The fabric-based computing system of claim 1 wherein said polymorphous computing fabric further comprises a mesh-interconnected network of interconnected runtime reconfigurable cells and wherein said plurality of runtime reconfigurable cells further comprises a plurality of homogeneous runtime reconfigurable cells.

5. The fabric-based computing system of claim 1 further comprising a global memory composed of the plurality of all local data memories of all cells and all local program memories of all cells within said polymorphous computing fabric.

6. The fabric based computing system of claim 5 wherein said global memory is dual ported for concurrent access by said hybrid CSOC processor assembly and at least one cell of said polymorphous computing fabric.

7. The fabric-based computing system of claim 2, said system further comprising:

at least two mesh-interconnected polymorphous computing fabric instances.

8. The fabric-based computing system of claim 1, wherein said hybrid CSOC processor assembly is placed in communication with said polymorphous computing fabric for sequential access to variables and instructions associated with the plurality of local data memories and at least one program memory of each said cells contained within said polymorphous computing fabric.

9. The fabric-based computing system of claim 1, wherein said hybrid CSOC processor assembly is placed in communication with said polymorphous computing fabric for circular access to variables and instructions associated with the plurality of local data memories and at least one program memory of each said cells contained within said polymorphous computing fabric.

10. A fabric-based computing system that behaves as a processing memory and which is dynamically customizable for execution on an application basis and on a per set of applications at one time due to said fabric's modifiable network parameters and cellular architecture, said system comprising:

a polymorphous computing fabric comprising an interconnected reconfigurable network composed of a plurality of runtime reconfigurable cells such that each of said runtime reconfigurable cells thereof comprises a plurality of local data memories and at least one local program memory; and a hybrid Configurable System On a Chip (CSOC) processor assembly comprising a host control processor and an integrated array of configurable logic cells on a single chip; and associated electronic components comprising broadcast busses, communication interfaces and registers for placing said hybrid CSOC processor assembly in communication with said polymorphous computing fabric's network of reconfigurable cells for randomly access to variables and instructions associated with the plurality of local data memories and at least one program memory of each said cell contained within said polymorphous computing fabric; and a global memory comprising all local data memories of all cells and all local program memories of all cells within said polymorphous computing fabric, wherein said global memory is dual ported for concurrent access by said hybrid CSOC processor assembly and at least one cell thereof, and wherein each of said plurality of runtime reconfigurable cells within said polymorphous computing fabric comprises a plurality of modules which form a modular architecture thereof, and which permit a change to occur within at least one module thereof without modification to other modules within a cell; and means for the hybrid CSOC processor assembly to modify said network parameters utilizing subroutines in order to—select a cell capability from source file dependent upon a number and size of local memories as well as supporting modular components contained therein, decide upon said cell's operational readiness state via an access controller to ensure that previous instructions have been executed, determine said cell's memory access pattern, bit mode and communication direction, retrieve previously generated data and clear an existing program from the local memories of said cell, compose an appropriate command in order to transmit new information to an address of a selected cell or set of cells, and send a new program or data to a selected cell or set of cells thereby enabling runtime reconfiguration of said cell during an application's execution on the fabric.

11. The fabric-based computing system of claims 1 or 10, wherein said means for modifying network parameters involves utilizing subroutines exercisable through a Procedure Access Generator (PAG).

12. A method for implementing a fabric-based computing system, said method comprising the steps of:
configuring a polymorphous computing fabric to behave as a processing memory that is dynamically customizable for execution on an application basis and on a per set of applications at one time due to said fabric's modifiable network parameters and a cellular architecture thereof;
forming said polymorphous computing fabric to further comprise an interconnected reconfigurable network composed of a plurality of runtime reconfigurable cells, such that each cell thereof comprises a plurality of local data memories and at least one local program memory;
providing a hybrid Configurable System On a Chip (CSOC) processor assembly comprising a host control processor and an integrated array of configurable logic cells on a single chip;
employing associated electronic components comprising broadcast busses, communication interfaces and registers to place said hybrid CSOC processor assembly in communication with said polymorphous computing fabric's network of reconfigurable cells for random access to variables and instructions associated with the plurality of local data memories and at least one program memory of each said cell contained within said polymorphous computing fabric; and
modifying said network parameters utilizing subroutines whereby the hybrid CSOC processor assembly is able to—select a cell capability from source file dependent upon a number and size of local memories as well as supporting modular components contained therein, decide upon said cell's operational readiness state via an access controller to ensure that previous instructions have been executed, determine said cell's memory access pattern, bit mode and communication direction, retrieve previously generated data and clear an existing program from the local memories of said cell, compose an appropriate command in order to transmit new information to an address of a selected cell or set of cells, and send a new program or data to a selected cell or set of cells thereby enabling runtime reconfiguration of said cell during an application's execution on the fabric.

13. The method of claim 12 further comprising the step of:
configuring each of said plurality of reconfigurable cells within said polymorphous computing fabric to comprise a plurality of modules that include data access, communications, program memory, data memory, function unit, loop and wait, and controller modules, which form a modular architecture thereof, and wherein said plurality of modules are adaptable to permit a change to occur within at least one module thereof without modification to other modules within a cell during runtime reconfiguration.

14. The method of claim 12 further comprising the steps of:
configuring said polymorphous computing fabric as an application specific network of interconnected runtime reconfigurable cells; and
configuring said plurality of runtime reconfigurable cells as a plurality of heterogeneous runtime reconfigurable cells.

15. The method of claim 12 further comprising the steps of:
configuring said polymorphous computing fabric as a mesh-interconnected network of interconnected runtime reconfigurable cells; and
configuring said plurality of runtime reconfigurable cells as a plurality of homogeneous runtime reconfigurable cells.

16. The method of claim 12 further comprising the step of:
forming a global memory from the plurality of all local data memories of all cells and all local program memories of all cells within said polymorphous computing fabric.

17. The method of claim 16 further comprising the step of:
configuring said global memory as a dual ported global memory, which is concurrently accessible by said hybrid CSOC processor assembly and at least one cell of said polymorphous computing fabric.

18. A method for implementing fabric-based computing system, said method comprising the steps of:
selecting a polymorphous computing fabric comprising an interconnected re-configurable network composed of a plurality of runtime re-configurable cells, such that each of said cells thereof comprises a plurality of local data memories and at least one local program memory, wherein said polymorphous computing fabric behaves as a processing memory that is dynamically customizable for execution on an application basis and on a per set of applications at one time and wherein said polymorphous computing fabric comprises a cellular architecture thereof;
providing a hybrid Configurable System On a Chip (CSOC) processor assembly comprising a host control processor and an integrated array of configurable logic cells on a single chip:
employing associated electronic components comprising broadcast busses, communication interfaces and registers to place said hybrid CSOC processor assembly in communication with said polymorphous computing fabric's network of reconfigurable cells for random access to variables and instructions associated with the plurality of local data memories and at least one program memory of each said cell contained within said polymorphous computing fabric;
forming a global memory from all local data memories of all cells and all local program memories of all cells within said polymorphous computing fabric, wherein said global memory is dual ported for concurrent access by said hybrid CSOC processor assembly and at least one cell thereof, and wherein each of said plurality of runtime reconfigurable cells within said polymorphous computing fabric comprise a plurality of modules which form a modular architecture thereof, and which permit a change to occur within at least one module thereof without modification to other modules within a cell; and
modifying said network parameters utilizing subroutines whereby the hybrid CSOC processor assembly is able to—select a cell capability from source file dependent upon a number and size of local memories as well as supporting modular components contained therein, decide upon said cell's operational readiness state via an access controller to ensure that previous instructions have been executed, determine said cell's memory access pattern, bit mode and communication direction, retrieve previously generated data and clear an existing program from the local memories of said cell, compose an appropriate command in order to transmit new information to an address of a selected cell or set of cells, and send a new program or data to a selected cell or set of cells thereby enabling runtime reconfiguration of said cell during an application's execution on the fabric.

19. The method of implementing a fabric-based computing system of claims 12 or 18, wherein the step of modifying said network parameters involves utilizing subroutines exercisable through a Procedure Access Generator (PAG).

* * * * *